(12) United States Patent
Goodner

(10) Patent No.: US 6,876,017 B2
(45) Date of Patent: Apr. 5, 2005

(54) POLYMER SACRIFICIAL LIGHT ABSORBING STRUCTURE AND METHOD

(75) Inventor: Michael D. Goodner, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/360,709

(22) Filed: Feb. 8, 2003

(65) Prior Publication Data

US 2004/0157415 A1 Aug. 12, 2004

(51) Int. Cl.[7] .......................... H01L 27/20; H01L 29/84
(52) U.S. Cl. .................. 257/254; 257/522; 257/758; 438/496; 438/796
(58) Field of Search .................. 438/496, 504, 438/534, 562, 634, 796; 257/254, 276, 410, 522, 664, 750, 758

(56) References Cited

U.S. PATENT DOCUMENTS 6,448,177 B1   9/2002   Morrow et al.
6,472,315 B2 * 10/2002   Nguyen et al. ............ 438/637
6,506,962 B1 * 1/2003   Bougri et al. ............. 800/279

* cited by examiner

Primary Examiner—Phuc T. Dang
(74) Attorney, Agent, or Firm—Michael D. Plimier

(57) ABSTRACT

Method and structure for optimizing dual damascene patterning with polymeric dielectric materials are disclosed. Certain embodiments of the invention comprise polymeric sacrificial light absorbing materials ("polymer SLAM") functionalized to have a controllable solubility switch wherein such polymeric materials have substantially the same etch rate as conventionally utilized polymeric dielectric materials, and subsequent to chemical modification of solubility-modifying protecting groups comprising the SLAM materials by thermal treatment or in-situ generation of an acid, such SLAM materials become soluble in weak bases, such as those conventionally utilized to remove materials in lithography treatments.

24 Claims, 8 Drawing Sheets

POLYMER SACRIFICIAL LIGHT ABSORBING STRUCTURE AND METHOD

BACKGROUND OF THE INVENTION

Dual damascene interconnects may enable reliable low cost production of integrated microelectronic circuits using sub 0.18 micron process technology. Process flows utilizing sacrificial light absorbing materials ("SLAM") may be employed to facilitate very small feature size dual damascene interconnects. With such techniques, a first etched region (e.g., a via or trench) may be filled with a sacrificial light absorbing material ("SLAM"), after such region has been formed within a dielectric layer. The SLAM preferably comprises a material having dry etch properties similar to those of the dielectric layer and anti-reflective (or light absorbing) properties that prevent lithographic-related defects during subsequent photoresist processing. After the first etched region is filled with the SLAM, a second etched region (e.g., a trench if the via is already formed or a via if the trench is already formed) may be formed within the dielectric layer. Some of the SLAM is removed as that second etched region is formed, as both the SLAM and the dielectric are etched. Remaining portions of the SLAM subsequently may be removed with a wet etch step or other conventional selective removal technique which does not significantly etch or alter the dielectric material.

SLAM process integrations utilizing appropriately matched materials may reduce, or eliminate, substrate reflection and the need for high etch selectivity, ensuring that such effects will not adversely affect dual damascene via and trench formation. Current SLAM materials utilized for substantially defect-free patterning are formulated for compatibility with conventional silicon oxide based dielectric materials in both etch rate and removability. To facilitate substantially defect-free patterning of polymer-based dielectric materials in process integration scenarios such as dual damascene, SLAM materials with etch and clean characteristics compatible with such polymer-based dielectric materials (i.e., "polymer SLAM" materials) are needed.

Absent preferable polymer SLAM materials, dual damascene integrations for polymer-based interlayer dielectric ("ILD") materials have been developed wherein dual hardmask process flows are employed. Such process flows are increasingly complex, providing potential sources of defects, and can be prohibitively expensive to implement in a manufacturing environment. Other dual damascene integrations for polymer-based ILD materials have utilized antireflective coating materials, such as "bottom organic antireflective coating" layers or "BOARC" layers. The implementation of BOARC layers in polymer dual damascene patterning, however, has been associated with problems due to inexact matching of etch rates between the BOARC materials and the polymer ILD materials, leading to defects known as "shell defects" and "microtrenching" or "cratering". Referring to FIGS. 1A and 1B, depictions of shell and crater defects are depicted. Additionally, the inability to effectively remove BOARC materials in the presence of polymer ILD materials in some instances can lead to additional process integration difficulties.

Accordingly, there is a need for materials and integration schemes to allow efficient dual damascene patterning with polymeric dielectric materials by substantially matching etch rates of subject polymeric dielectric materials with polymeric SLAM materials to facilitate removal of the SLAM after pertinent process treatments without damaging adjacent polymeric dielectric structures.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 2A:
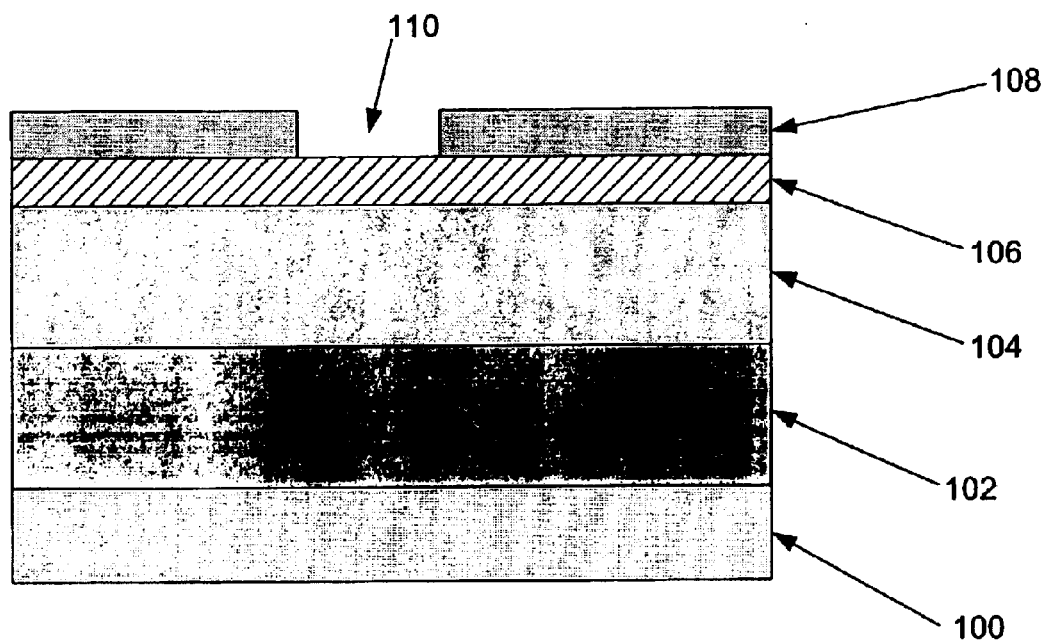
FIGS. 2A–2I depict cross-sectional views of various aspects of one embodiment of the present invention wherein a polymeric SLAM is utilized for dual damascene patterning.

Referring to FIG. 2A, a microelectronic structure, such as a semiconductor structure, is depicted having a substrate layer (100) adjacent a two-part dielectric structure having a first dielectric layer, or "via" dielectric layer (102) for convenience, positioned between the substrate layer (100) and a second, or "line" dielectric layer (104). In another embodiment, the via and line (102, 104) dielectric layers may comprise portions of a single dielectric layer which may be homogeneous or not, as would be apparent to one skilled in the art. The depicted embodiment is a variation of a dual damascene interconnect predecessor wherein a conductive layer (not shown) may comprise a via portion aligned with the depicted via dielectric layer (102) and a line portion aligned with the line dielectric layer (104), as would be apparent to one skilled in the art. Adjacent the line dielectric layer (104) is a hard mask dielectric layer (106) and a patterned photoresist layer (108).

The substrate layer (100) may be any surface generated when making an integrated circuit, upon which a conductive layer may be formed. The substrate layer (100) thus may comprise, for example, active and passive devices that are formed on a silicon wafer, such as transistors, capacitors, resistors, diffused junctions, gate electrodes, local interconnects, etcetera. The substrate layer (100) may also comprise insulating materials (e.g., silicon dioxide, either undoped or doped with phosphorus or boron and phosphorus; silicon nitride; silicon oxynitride; carbon-doped oxide; or a polymer) that separate active and passive devices from the conductive layer or layers that are formed adjacent them, and may comprise other previously formed conductive layers.

The via (102) and line (104) dielectric layers preferably comprise low dielectric constant dielectric materials such as those conventionally utilized in dual damascene interconnect integrations. While the via dielectric (102) may be either an inorganic (silicon dioxide, carbon-doped oxide or related dielectric materials) or polymeric low dielectric constant material, the line dielectric (104) is preferentially a polymeric material.

Suitable dielectric polymers for these layers (102, 104), for example, include but are not limited to organic polymeric materials such as poly(norbornene), such as those sold under the tradename UNITY™, distributed by Promerus, LLC; cross-linked photoresist; photosensitive polyimide; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. Other suitable materials include but are not limited to polystyrene, poly(p-phenylene), polyxylene, and cross-linked polymethylmethacrylate ("PMMA"). The via (102) and line (104) dielectric layers collectively have a thickness between about 10 nanometers and about 2,000 nanometers in preferred embodiments, and may be formed using conventional deposition techniques such as spin-on for suitable polymers, conventional chemical vapor deposition ("CVD"), plasma-enhanced CVD ("PECVD"), or physical vapor deposition ("PVD"). While the via (102) and line (104) dielectric layers may comprise the same material, they preferably vary in that the via dielectric layer comprises a more robust structural dielectric material, generally having a relatively higher dielectric constant as compared with preferred materials for the line dielectric layer (104) which have more preferred dielectric properties to surround subsequently formed conductive lines (not shown). The line dielectric layer (104), for example, may comprise a porous structure, or may be selected for selective removability to leave behind an air gap as disclosed in U.S. Patent Applications for "Low-K Dielectric Structure and Method", "Formation of Interconnect Structures by Removing Sacrificial Material with Supercritical Carbon Dioxide", and "Selectively Converted Inter-layer Dielectric", Ser. Nos. 10/301,957, 10/301,976 and 10/302,073 respectively, to the same assignee of the present invention.

The hard mask dielectric layer (106) may comprise a dielectric material conventionally paired with the materials selected for the photoresist (108), via dielectric layer (102), and line dielectric layer (104) to have a significantly different etch rate than such materials when exposed to solvents or etchants utilized for patterning and etching of such layers. Materials in the so-called "hard mask" position occupied by the depicted hard mask dielectric layer (106) typically have a protective functionality in terms of etch rate, mechanical barrier protection, and/or chemical barrier protection for layers between it and the substrate layer (100), as would be apparent to those skilled in the art. Suitable materials for the hard mask dielectric layer (106) include but are not limited to silicon dioxide; silicon nitride; silicon carbide; aluminum oxide; aluminum phosphate; boron nitride; porous materials known as "zeolites", such as highly-ordered mesoporous silica and aluminosilicate; a siloxane-based polymer sold under the trade name "LKD-5109™", distributed by JSR Microelectronics Corporation, which may be formed into porous layers; fluorinated silicate glass ("FSG"); porous and nonporous carbon doped oxide ("CDO"), having the molecular structure $Si_x O_y R_z$, in which "R" is an alkyl or aryl group, the CDO preferably comprising between about 5 and about 50 atom % carbon, and more preferably, about 15 atom % carbon; a CVD-deposited CDO sold under the trade name "Black Diamond™", distributed by Applied Materials Corporation; siloxane-based polymers, such as those sold under the trade names "Nanoglass E™" and "Zirkon™", distributed by Honeywell Corporation and Shipley Corporation, respectively; a spin-on low-k silicon dioxide variant sold under the trade name "FOx™", distributed by Dow Corning Corporation; a CVD-deposited CDO sold under the trade name "Coral™", distributed by Novellus Corporation; and electron-beam-cured CVD-deposited CDO materials. It is generally desirable that layers positioned for hard mask functionality have as small a thickness as possible while still allowing for reliable etching. Depending upon the etchants and materials selected for adjacent structures, the hard mask dielectric layer (106) may be deposited using conventional techniques, such as spin-on, CVD, PECVD, evaporative deposition, or physical vapor deposition ("PVD") to form a layer having a thickness between about 10 nanometers and about 300 nanometers. Zeolite materials may be synthesized by an aerogel or xerogel process, spin-coated into place, or deposited using CVD to form a voided structure upon deposition.

The patterned photoresist layer (108) preferably comprises a conventional lithography photoresist material, which is deposited preferably using spin-on or PVD techniques and patterned using conventional masking, irradiation, and developing treatments.

Figure 2B:
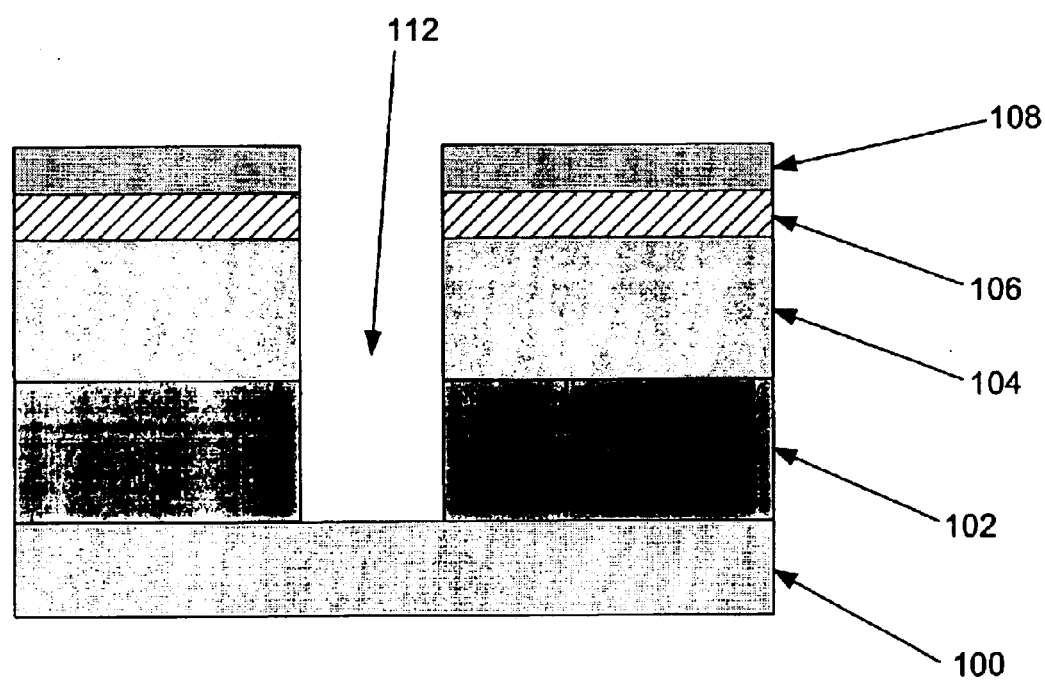
Figure 2C:
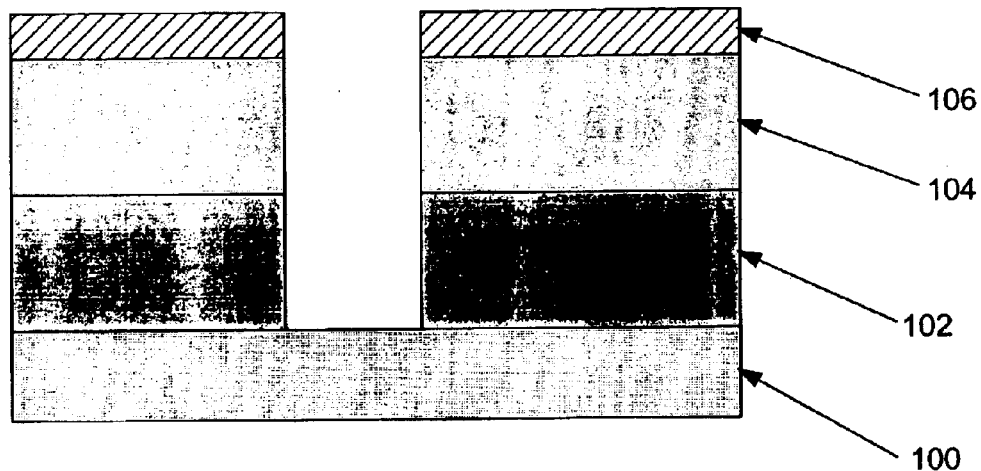
Figure 2D:
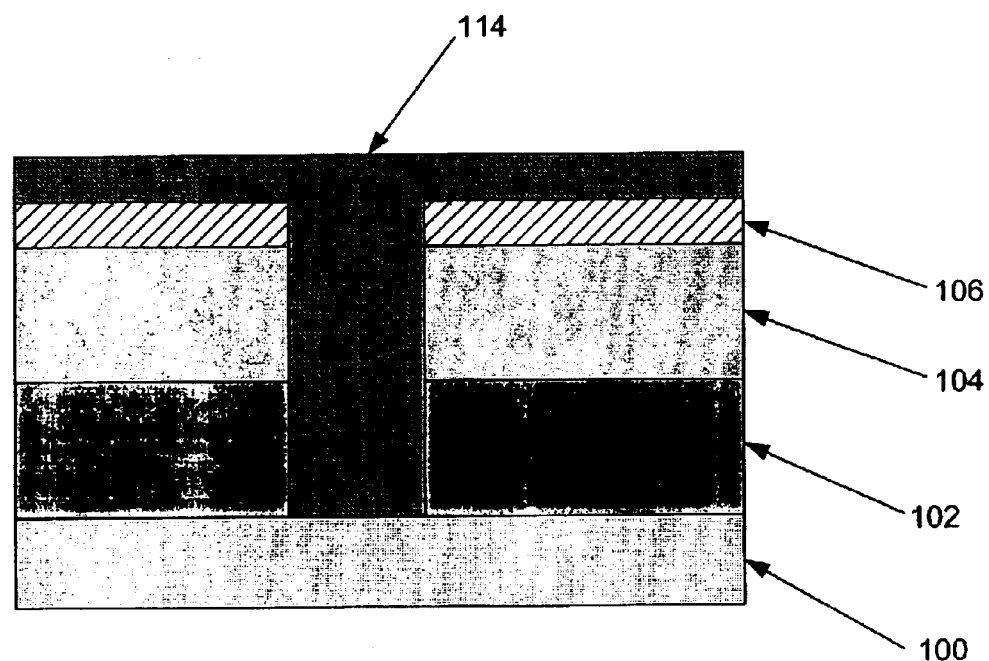
Figure 2E:
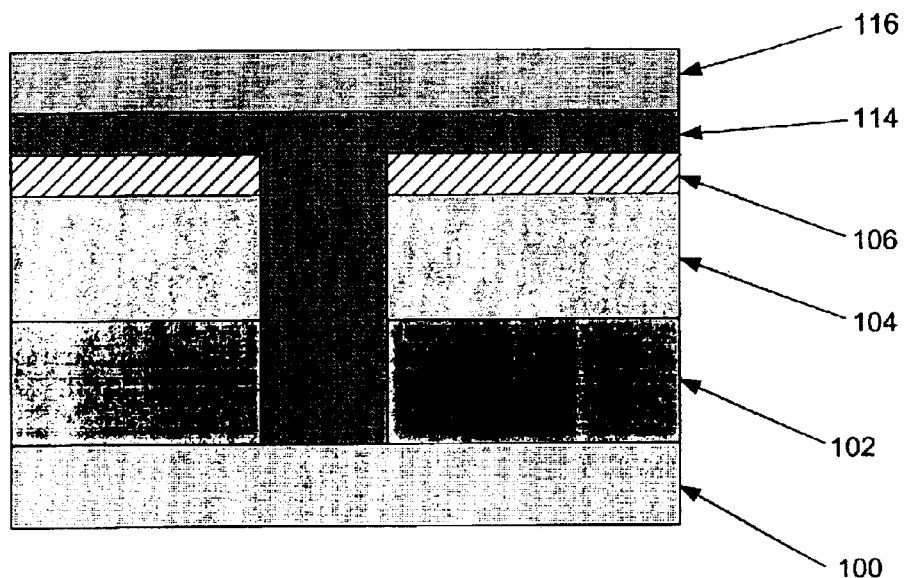
Figure 2F:
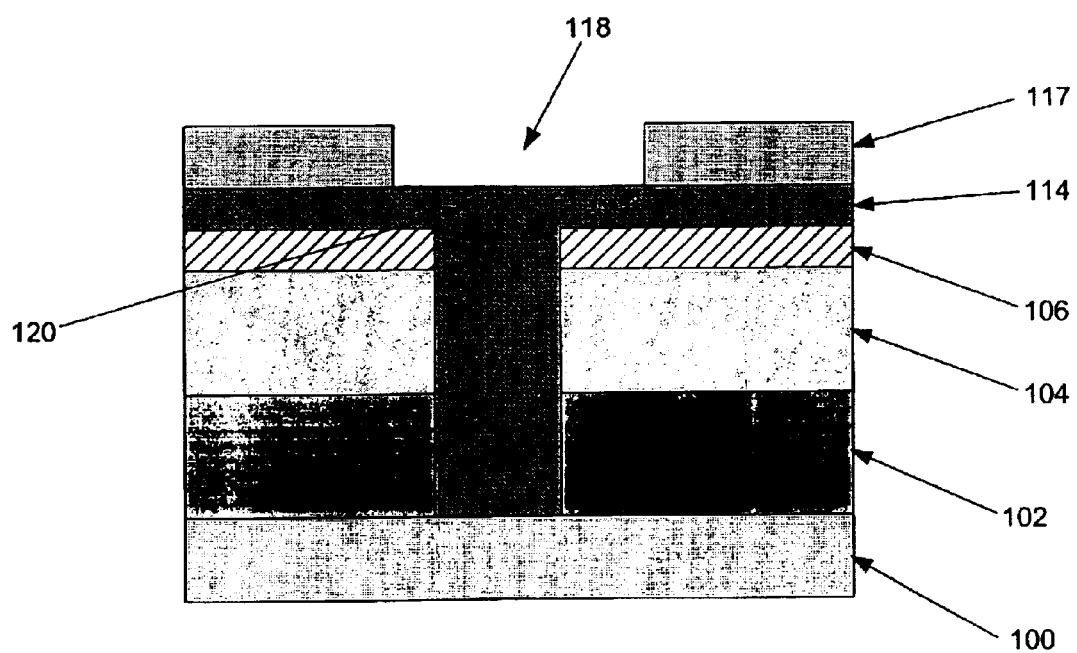
Figure 2G:
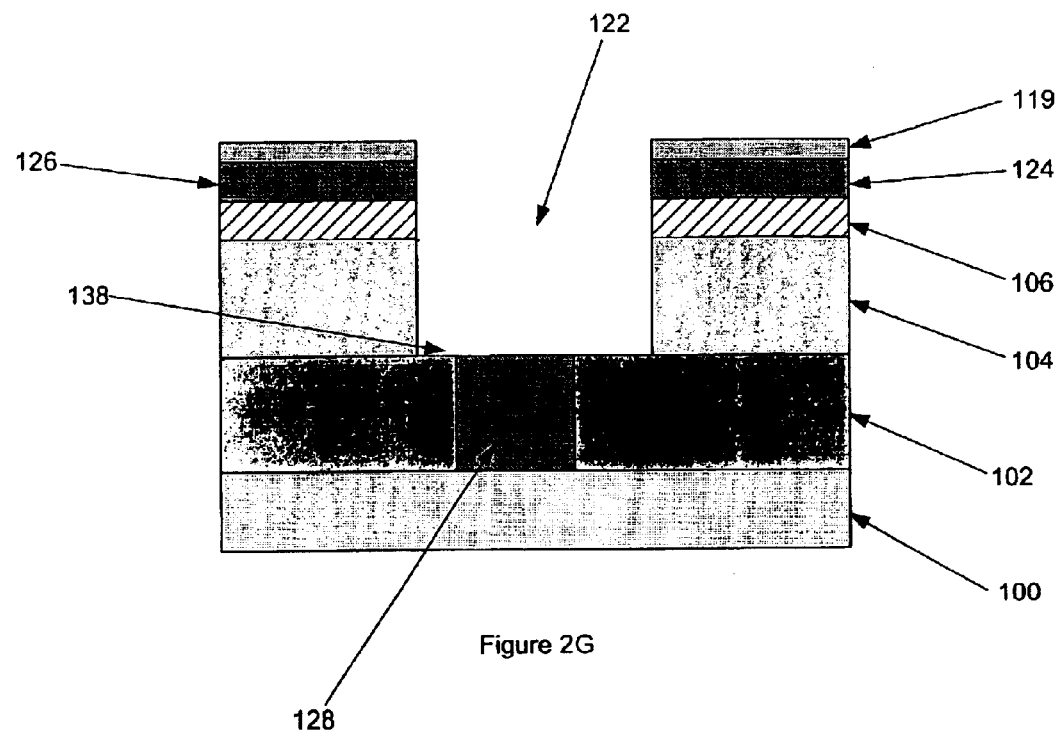

Referring to FIG. 2B, the trench pattern (110) of the structure of FIG. 2A has been transferred into the hard mask dielectric layer (106), the line dielectric layer (104), and the via dielectric layer (102), preferably using substantially anisotropic conventional dry etching techniques such as plasma etching. To define the trench (112) across the dielectric layers (102, 104, 106) to the substrate layer (100) as depicted in FIG. 2B, etch chemistries, for example fluorine-, chlorine-, oxygen- or forming gas-based plasma etch chemistries, are selected in accordance with the subject materials comprising the structures adjacent the enlarged trench (112), as would be apparent to one skilled in the art. Conventional wet etch treatments may also be utilized to form an enlarged trench (112). Referring to FIG. 2C, the patterned photoresist layer of FIG. 2B (108) has been removed using conventional techniques to enable deposition of the polymer SLAM layer (114), as depicted in FIG. 2D, to substantially fill the trench (112) depicted in FIG. 2B. The polymer SLAM layer (114) preferably is deposited using spin-on techniques, and is selected for controlled removability subsequent to further patterning and trench enlargement as illustrated in FIGS. 2E–2G.

As described above, it is preferable that the SLAM layer (114) etch at a similar rate to the line (104) dielectric when subject to a common etching chemistry for the line (104) dielectric. In addition, the "sacrificial" nature of the SLAM layer (114) requires that the material comprising it be removable subsequent to requisite patterning and etching steps to form an enlarged interconnect trench. In a preferred embodiment, these objectives are met by utilizing a SLAM polymer for the SLAM layer (114) which is controllably soluble in etch chemistries typically utilized to break down polymers having a similar polymeric backbone. By "controllably soluble" it is meant that as deposited, the preferred SLAM layer (114) materials are not soluble in the proposed removal etch chemistries, whereas after irradiation, heating, or both, the solubility of the SLAM layer (114) material is converted or modified to result in solubility and removability with such etch chemistries. The SLAM polymer preferably is convertible to substantially the same solubility as the adjacent dielectric polymeric material.

Figure 3A:
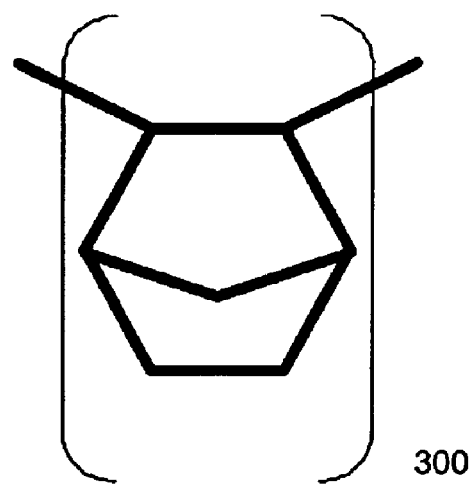
FIGS. 3A–3D depict poly(norbornene)-based chemical structures utilized in various embodiments of the present invention.
Figure 3B:
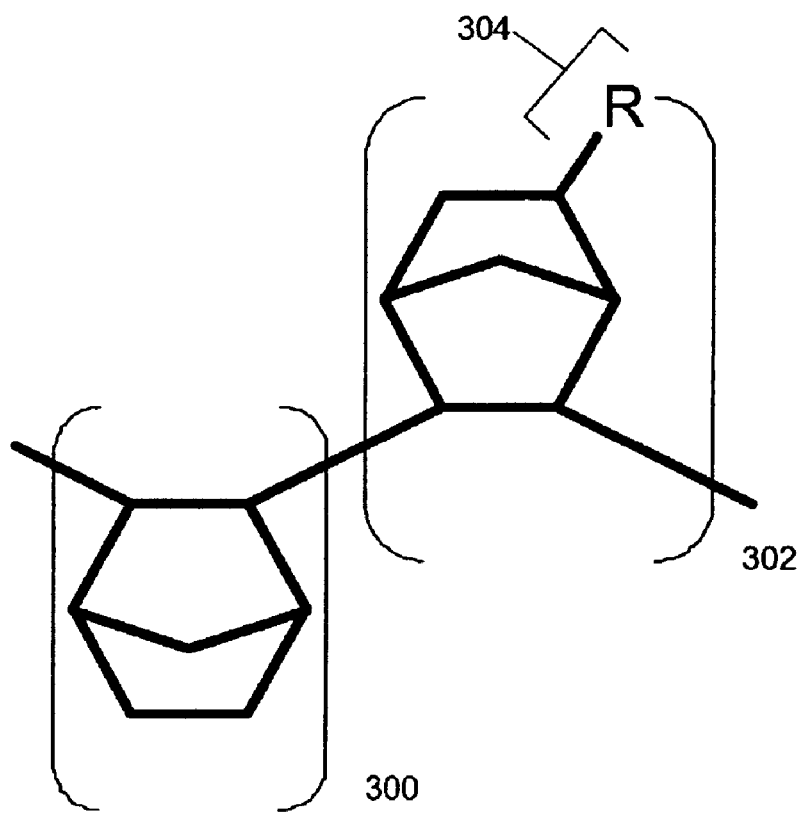
Figure 3C:
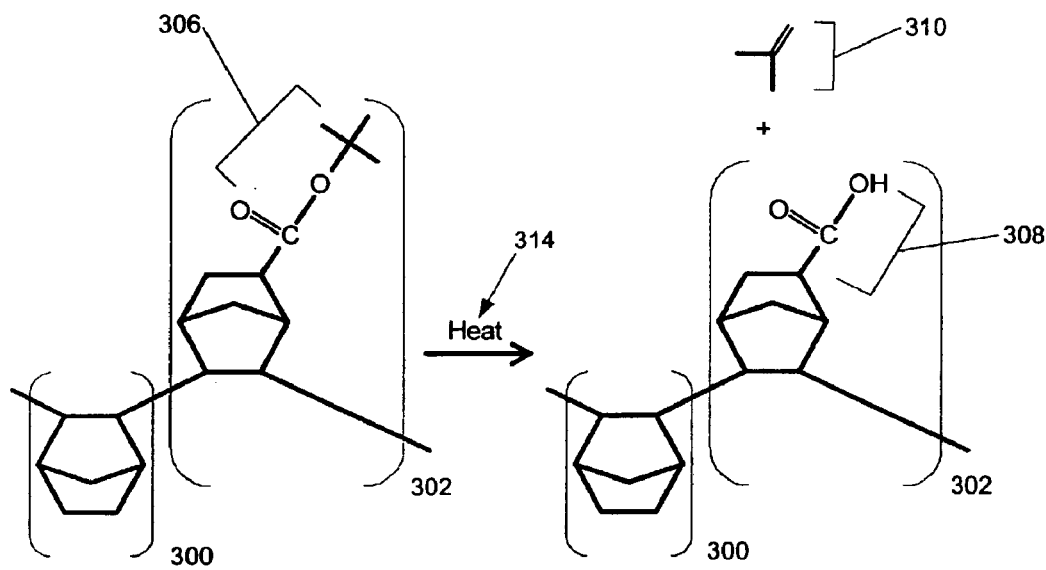

For convenience in matching etch rates in a given etch chemistry, the line dielectric layer (104) and SLAM layer (114) may have the same polymeric backbone. For example, in one embodiment, each of these layers comprises a poly (norbornene) backbone element (300), such as that depicted in FIG. 3A. The material comprising the SLAM layer (114), however, preferably is functionalized with side groups ("protecting groups"—304) to provide controlled solubility switching, or "deprotection", by either thermal or acid-catalyzed means, as depicted in FIG. 3B. For comparative purposes, an unfunctionalized poly(norbornene) backbone element (300) is depicted adjacent a functionalized element (302) with a generic protecting group (304) in FIG. 3B. Similarly, FIG. 3C depicts an unfunctionalized poly (norbornene) backbone element (300) adjacent a functionalized element (302) comprising a tert-butyl ester protecting group (306). In one embodiment, tert-butyl ester protecting groups are paired with poly(norbornene) backbone elements to form repeating functionalized elements, such as that (302) depicted in FIG. 3C, which are controllably soluble. In other embodiments, controllably soluble functionalized elements may include protecting groups comprising tert-butoxycarbonate, adamantyl ester, adamantyl ether, adamantyl carbonate, alicyclic ester, alicyclic ether, alicyclic carbonate, alicyclic maleimide, alkyl ester, alkyl ether, alkyl carbonate, alkyl maleimide, aryl ester, aryl ether, aryl carbonate, aryl maleimide, acetal, ketal, or other protecting groups used in photolithographic resist formulations, as would be apparent to those skilled in the art. Prior to deprotection, while the protecting groups are still chemically attached to the polymer, the polymer is insoluble in weak basic etch chemistries, such as tetramethyl ammonium hydroxide ("TMAH") or potassium hydroxide. During deprotection, the chemical bonds joining the protecting groups to the polymer are broken, thereby converting the polymer to a material which is soluble in weak basic etch chemistries.

In one embodiment of the invention, illustrated in FIG. 3C, deprotection is accomplished by thermal treatment (314) alone, as each of the protecting groups (306) is subject to undergoing a deprotection reaction without an acid catalyst upon heating, to form an attached portion (308) which renders the polymer soluble, and a detached portion (310). In such an embodiment, the protecting group (306) preferably is chosen so that the thermal decomposition occurs at a temperature higher than the processing temperature for the subsequently applied photoresist (116) but lower than the decomposition for a porogen in a porous dielectric or a sacrificial material used as a dielectric in the associated layers (102, 104, 106). A suitable pairing for such an embodiment comprises a polynorbornene-based SLAM with a tert-butyl ester side group, which may be thermally treated to undergo deprotection subsequent to heating, preferably using a conventional technique such as a hotplate, to a temperature between about 150 and 200 degrees Celsius for between about 30 seconds and 10 minutes, and more preferably between about 170 and 180 degrees Celsius for between about 30 seconds and 2 minutes.

Figure 3D:
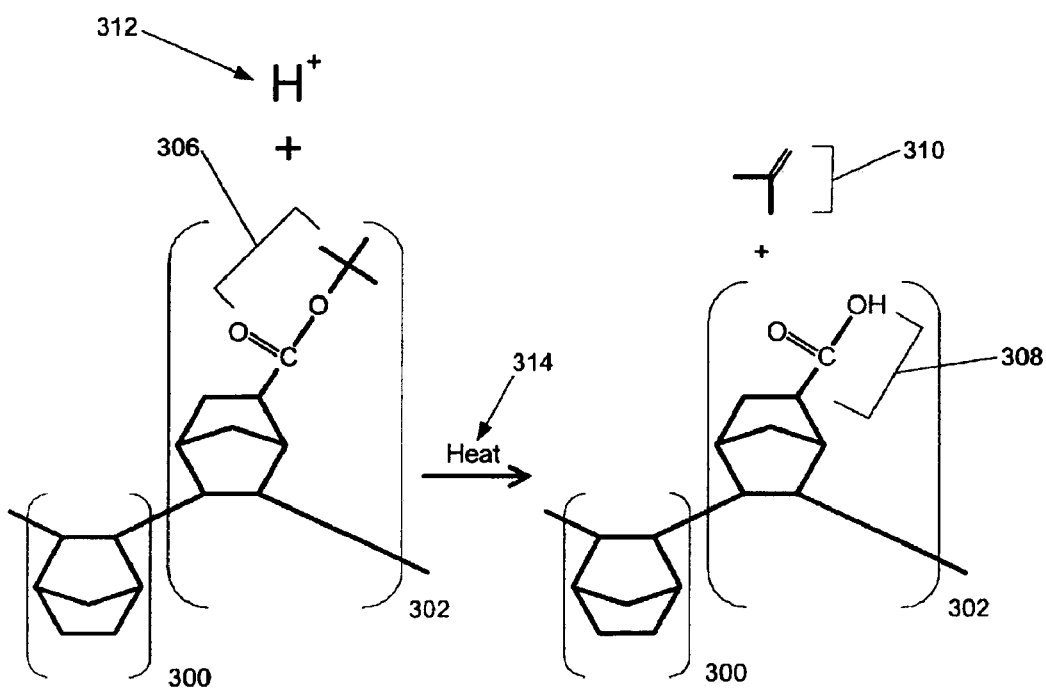

In other embodiments, deprotection may be catalyzed by an acid which is generated by a thermal acid generator ("TAG") or photoacid generator ("PAG") compound added to the SLAM polymer. TAGs and PAGs may be termed "acid catalysts". Referring to FIG. 3D, a functionalized element (302) comprising a protecting group (306) such as those discussed in reference to FIG. 3C may be deprotected with heat (314) combined with acid catalysis (312), in which the acid is generated by an acid generator compound which is triggered either by irradiation, the case of a PAG, or the heat itself, in the case of a TAG.

A TAG is a compound which generates protons (an acid) upon thermal treatment. Examples of thermal acid generators include, but are not limited to, diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts. The TAG preferably generates acid to catalyze a deprotection reaction upon reaching a temperature between about 100 and about 350 degrees Celsius, or more preferentially between about 150 and about 300 degrees Celsius, subsequent to which the deprotected SLAM may be broken down and removed using etch chemistries such as TMAH.

In another embodiment, a PAG may be utilized as a source for protons to catalyze the deprotection reaction leading to similar solubility results. While PAGs may be activated by exposure to irradiation not necessarily having the same wavelength as that for irradiating the photoresist layer (116), they may also be activated with heat. If the PAG is activated by irradiation, substantially long processing times or high exposure energies may be required to deprotect thick layers of SLAM, as the light-absorbing nature of the material will reduce the intensity of radiation reaching the lower regions of the SLAM considerably. Suitable PAGs include but are not limited to onium salts, sulfides, nitroaryl derivatives or aryl sulfates such as diphenyl iodide hexafluorophosphate, diphenyl iodide hexafluoroarsenate, diphenyl iodide hexafluoroantimonate, diphenyl p-methoxyphenyl triflate, diphenyl p-tert-butylphenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, triphenylsulfonium nonafluorobutylsulfonate, diphenyliodonium heptadecafluorooctylsulphonate, and dibutylnaphthysulfonium triflate. Referring again to FIG. 3D, subsequent to acid (312) catalyzed thermal (314) deprotection, a protecting group (306) is controllably converted to comprise an attached portion (308) which renders the polymer soluble and a detached portion (310). One preferred pairing, for example, comprises a poly(norbornene)-based SLAM functionalized with a triphenylsulfonium perfluoroalkylsulfonate PAG, such as triphenylsulfonium nonafluorobutylsulfonate, for which acid-catalyzed deprotection may be achieved with flood irradiation at wavelengths of 248 nanometers or 365 nanometers and thermal treatment using a standard technique, such as hotplate heating, to a temperature between about 70 and 200 degrees Celsius, or more preferentially between about 100 and about 140 degrees Celsius, for between about 30 seconds and about 2 minutes.

As described above, it is preferable that the polymer SLAM material absorb irradiation utilized for lithography treatments subsequent to deposition of the polymer SLAM material. For some polymer SLAM/lithography combinations, this characteristic is inherent to the system. For example, unless modified specifically for transparency, poly(norbornene) polymers have high absorbance at 157 nanometer and 193 nanometer wavelengths, which are common in advanced lithographic processing. For instances in which the polymer SLAM material is not absorbant at the exposure wavelength, a dye may be added to impart the light-absorbing characteristics to the material formulation. The dye may either be a distinct molecule, i.e., a separate molecule from the SLAM polymer, known as a "contained" dye, or may be an additional side group functionality added to the polymer formulation. Applicable contained and side group dye moieties are well known by those skilled in the art. For example, aromatic functionalities are absorbent to radiation having the aforementioned wavelengths of 157 nanometers and 193 nanometers.

Other than poly(norbornene), many polymers are suitable as backbone polymers for the polymer SLAM layer (114). For example, the backbone may comprise polystyrene; poly(p-phenylene); polyxylene; polyimide; cross-linked PMMA; polyarylene-based polymeric dielectrics such as that sold under the trade name "SiLK™", distributed by Dow Chemical Corporation; poly(aryl ether)-based polymeric dielectrics such as that sold under the trade name "FLARE™", distributed by Honeywell Corporation; and polyarylene-based spin-on dielectrics such as that sold under the trade name "GX-3™", also from Honeywell Corporation. As noted above, the SLAM layer (114) preferably is deposited using spin on techniques. Depending upon the material selected for this and other associated layers, the SLAM layer (114) also may be deposited using other conventional techniques, such as CVD, PECVD, evaporative deposition, and PVD.

The implementation of a convertible or deprotectable polymer SLAM material is further illustrated in reference to FIGS. 2E–2I. Referring to FIG. 2E, a photoresist layer (116) is deposited, preferably using spin-on techniques, over the SLAM layer (114). The photoresist layer of FIG. 2E (116) is patterned and developed using conventional techniques to form the patterned photoresist layer (117) and trench (118) of FIG. 2F. As shown in FIG. 2F, a region (120), outlined by a dashed line, of the SLAM layer (114) may be eroded and partially removed in the case of a PAG-containing SLAM formulation due to the leakage of some irradiation to the region (120), if the PAG comprising such SLAM material are triggered by the same irradiation utilized for the resist patterning. In the case of a TAG-containing or non-catalyzed SLAM formulation, the outlined region (120) does not become substantially eroded since the requisite deprotection temperature threshold is not met during patterning of the photoresist.

Figure 1A:
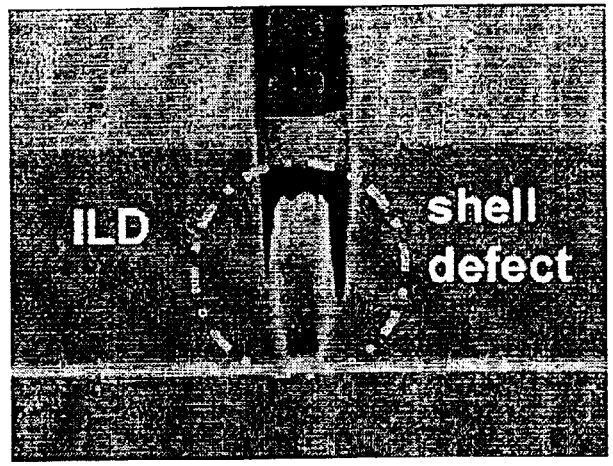
FIG. 1A depicts a cross-sectional view of a microelectronic structure having a shell defect.
Figure 1B:
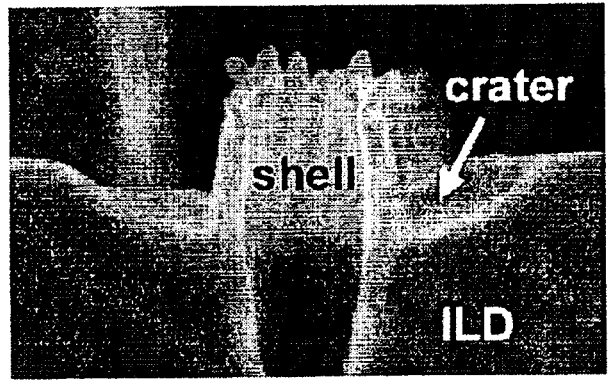
FIG. 1B depicts a cross-sectional view of a microelectronic structure having both a shell defect and a crater defect.

Referring to FIG. 2G, the pattern is transferred using conventional anisotropic etching techniques, such as plasma reactive-ion etching, to form an enlarged trench (122), leaving three discrete portions of the remaining SLAM material (124, 126, 128). The substantially similar dry etch rates of the materials comprising the line dielectric (104) and the SLAM material (124, 126, 128) enable formation of a enlarged trench (122) having a substantially planar bottom (138) defined in part by the polymer SLAM layer (128) and in part by the polymer via dielectric layer (102), as depicted, avoiding the shell and crater defects depicted in FIGS. 1A and 1B. A thinned photoresist crust (119) remains subsequent the etching to form the enlarged trench (122) in the illustrated embodiment.

Figure 2H:
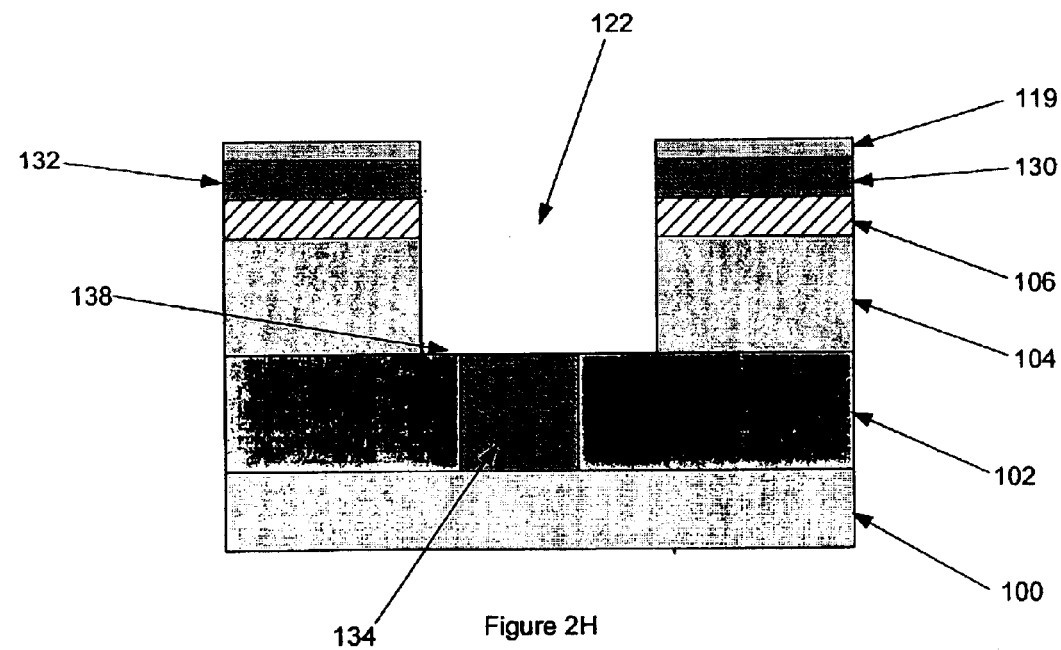
Figure 2I:
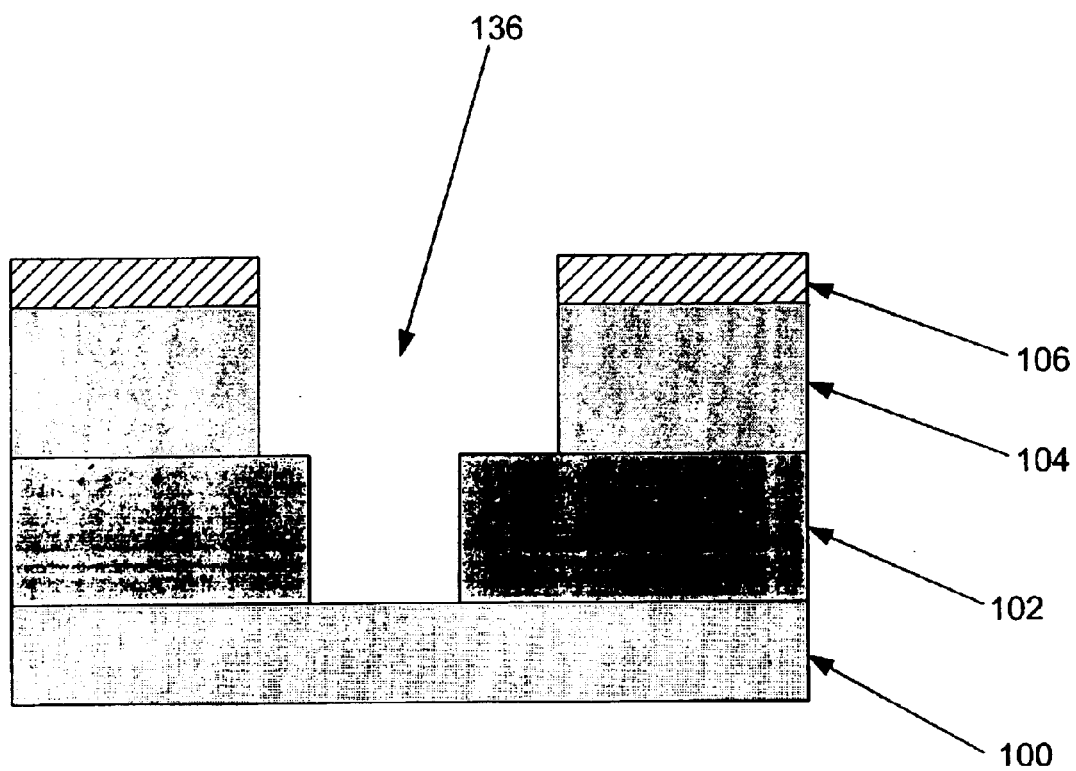

The structure depicted in FIG. 2H is similar to that of FIG. 2G with the exception that the SLAM material of the structure of FIG. 2H is deprotected SLAM material (130, 132, 134) as a result of a controlled deprotection or solubility switching reaction, which, as described above, may be catalyzed by irradiation, heating, or both, depending upon the functionality of the SLAM material. Subsequent to deprotection, the soluble SLAM material (130, 132, 134) may be selectively removed using solvents conventionally effective on the deprotected backbone material comprising the SLAM material, to leave the structures depicted in FIG. 2I remaining. In the case of a poly(norbornene)-based SLAM material, subsequent to deprotection, the SLAM material portions (130, 132, 134) may be removed with a weak base such as TMAH. Subsequent to removal of the thinned photoresist layer (119) and the SLAM material portions (130, 132, 134), a structure similar to that of FIG. 2I results and may be utilized to form a dual damascene interconnect with the placement of, for example, a barrier layer (not shown) and a copper conductive layer (not shown) in the enlarged trench (136).

Thus, a novel polymer SLAM solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A microelectronic structure comprising:
    a substrate layer;
    a dielectric layer positioned adjacent the substrate layer, the dielectric layer comprising a dielectric polymer and defining a trench across the dielectric layer to the substrate layer; and
    a SLAM layer substantially filling the trench, the SLAM layer comprising a SLAM polymer convertible to substantially the same solubility as the dielectric polymer.

2. The microelectronic structure of claim 1 wherein the dielectric polymer comprises a polymer from the list consisting of poly(norbornene), polyimide, polyarylene, poly (aryl ether), polystyrene, poly(p-phenylene), polyxylene, and cross-linked PMMA.

3. The microelectronic structure of claim 1 wherein the SLAM polymer comprises a polymer selected from the list consisting of poly(norbornene), polyimide, polyarylene, poly(aryl ether), polystyrene, poly(p-phenylene), polyxylene, and cross-linked PMMA.

4. The microelectronic structure of claim 1 wherein the SLAM polymer and dielectric polymer comprise substantially the same backbone.

5. The microelectronic structure of claim 1 wherein the SLAM polymer is functionalized with a protecting group.

6. The microelectronic structure of claim 5 wherein the protecting group comprises a compound selected from the list consisting of tert-butyl ester, tert-butoxycarbonate, adamantyl ester, adamantyl ether, adamantyl carbonate, alicyclic ester, alicyclic ether, alicyclic carbonate, alicyclic maleimide, alkyl ester, alkyl ether, alkyl carbonate, alkyl maleimide, aryl ester, aryl ether, aryl carbonate, aryl maleimide, ketal, and acetal.

7. The microelectronic structure of claim 1 wherein the SLAM polymer comprises a thermal acid generator.

8. The microelectronic structure of claim 1 wherein the SLAM polymer comprises a photo acid generator.

9. The microelectronic structure of claim 1 wherein the SLAM polymer formulation comprises a dye.

10. The microelectronic structure of claim 9 wherein the dye is a contained dye or a side group dye.

11. The microelectronic structure of claim 7 wherein the thermal acid generator is one selected from the list consisting of diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts.

12. The microelectronic structure of claim 8 wherein the photo acid generator is one selected from the list consisting of diphenyl iodide hexafluorophosphate, diphenyl iodide hexafluoroarsenate, diphenyl iodide hexafluoroantimonate, diphenyl p-methoxyphenyl triflate, diphenyl p-tert-butylphenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, triphenylsulfonium nonafluorobutylsulfonate, diphenyliodonium heptadecafluorooctylsulphonate, and dibutylnaphthysulfonium triflate.

13. A microelectronic structure comprising:
   a substrate layer;
   a dielectric layer positioned adjacent the substrate layer, the dielectric layer comprising a dielectric polymer and defining a trench across the dielectric layer to the substrate layer; and
   a SLAM layer substantially filling the trench, the SLAM layer comprising a SLAM polymer functionalized with a protecting group and convertible from a first solubility to a second solubility by removal of the protecting group from the SLAM polymer.

14. The microelectronic structure of claim 13 wherein the SLAM polymer comprises a polymer selected from the list consisting of poly(norbornene), polyimide, polyarylene, poly(aryl ether), polystyrene, poly(p-phenylene), polyxylene, and cross-linked PMMA.

15. The microelectronic structure of claim 13 wherein the protecting group comprises a compound selected from the list consisting of tert-butyl ester, tert-butoxycarbonate, adamantyl ester, adamantyl ether, adamantyl carbonate, alicyclic ester, alicyclic ether, alicyclic carbonate, alicyclic maleimide, alkyl ester, alkyl ether, alkyl carbonate, alkyl maleimide, aryl ester, aryl ether, aryl carbonate, aryl maleimide, ketal, and acetal.

16. The microelectronic structure of claim 13 wherein the SLAM polymer and dielectric polymer comprise substantially the same backbone.

17. A microelectronic structure comprising:
   a substrate layer;
   a dielectric layer positioned adjacent the substrate layer, the dielectric layer comprising a dielectric polymer and defining a trench across the dielectric layer to the substrate layer, the dielectric polymer having a first etch rate; and
   a SLAM layer substantially filling the trench, the SLAM layer comprising a SLAM polymer with a second etch rate substantially matching the first etch rate, the SLAM polymer being convertible from a first solubility to a second solubility, the second solubility being substantially more soluble than the first solubility.

18. The microelectronic structure of claim 17 wherein the SLAM polymer is functionalized with a protecting group.

19. The microelectronic structure of claim 18 wherein the SLAM polymer is convertible from the first solubility to the second solubility by removal of the protecting group.

20. The microelectronic structure of claim 18 wherein the protecting group comprises a compound selected from the list consisting of tert-butyl ester, tert-butoxycarbonate, adamantyl ester, adamantyl ether, adamantyl carbonate, alicyclic ester, alicyclic ether, alicyclic carbonate, alicyclic maleimide, alkyl ester, alkyl ether, alkyl carbonate, alkyl maleimide, aryl ester, aryl ether, aryl carbonate, aryl maleimide, ketal, and acetal.

21. The microelectronic structure of claim 17, wherein the first and second solubilities are solubitities in a weak basic solution.

22. The microelectronic structure of claim 21 wherein the dielectric polymer has a third solubility in the weak basic solution, the third solubility being substantially less soluble in the weak basic solution than the second solubility.

23. The microelectronic structure of claim 22, wherein the weak basic solution comprises a solution selected from the list consisting of tetramethyl ammonium hydroxide and potassium hydroxide.

24. The microelectronic structure of claim 22 wherein the first and second etch rates are etching rates during a dry etch process.

* * * * *